United States Patent
Gnepf et al.

(10) Patent No.: US 6,336,081 B1
(45) Date of Patent: Jan. 1, 2002

(54) GEOMAGNETIC FIELD DIRECTION MEASURING SYSTEM

(75) Inventors: Silvio Gnepf, Heerbrugg; Ernst Ramseier, Widnau, both of (CH)

(73) Assignee: Leica Geosystems AG, Heerbrugg (CH)

( * ) Notice: Subject to any disclaimer, the term of this patent is extended or adjusted under 35 U.S.C. 154(b) by 0 days.

(21) Appl. No.: 09/355,760
(22) PCT Filed: Jan. 30, 1998
(86) PCT No.: PCT/EP98/00489
§ 371 Date: Oct. 8, 1999
§ 102(e) Date: Oct. 8, 1999
(87) PCT Pub. No.: WO98/35205
PCT Pub. Date: Aug. 13, 1998

(30) Foreign Application Priority Data

Feb. 10, 1997 (DE) ............................................. 197 04 956

(51) Int. Cl.[7] .................................................. G01C 21/20
(52) U.S. Cl. ........................... 702/150; 702/92; 324/202; 33/356
(58) Field of Search ................... 702/65–66, 69, 702/74, 67, 92, 93, 108, 116, 183, 150–153, FOR 103–FOR 105, FOR 110, FOR 134–FOR 135, FOR 170–FOR 171; 324/244, 350, 345, 348, 323, 260, 200; 33/357, 356; 701/4, 1, 13, 224

(56) References Cited

U.S. PATENT DOCUMENTS

| | | | | | |
|---|---|---|---|---|---|
| 4,497,034 A | * | 1/1985 | Kuno et al. | ...................... | 702/92 |
| 4,539,760 A | | 9/1985 | Marchant et al. | .............. | 33/356 |
| 4,611,293 A | * | 9/1986 | Hatch et al. | ...................... | 702/92 |
| 4,660,161 A | * | 4/1987 | Okada | .............................. | 702/92 |
| 4,672,565 A | * | 6/1987 | Kuno et al. | ...................... | 702/92 |
| 4,797,841 A | * | 1/1989 | Hatch | .............................. | 702/92 |
| 5,131,155 A | * | 7/1992 | Takano et al. | ................... | 33/356 |
| 5,151,872 A | * | 9/1992 | Suzuki et al. | ................... | 702/92 |
| 5,216,816 A | * | 6/1993 | Ida | .................................. | 33/356 |
| 5,995,913 A | * | 11/1999 | Dittrich et al. | ................. | 702/92 |
| 6,049,761 A | * | 4/2000 | Hoshino et al. | ................ | 702/92 |
| 6,192,315 B1 | * | 2/2001 | Geschke et al. | ............. | 701/224 |

FOREIGN PATENT DOCUMENTS

| | | |
|---|---|---|
| DE | 38 33 798 A1 | 4/1990 |
| EP | 0 145 950 | 6/1985 |
| EP | 0 387 991 | 9/1990 |

OTHER PUBLICATIONS

Patent Abstracts of Japan, (JP 60–135814), vol. 009, No. 299 (p–409), Nov. 27, 1985.

Wynn, W.M., et al., "Advanced Superconducting Gradiometer/Magnetometer Arrays and a Novel Signal Processing Technique," IEEE Transations of Magnetics, vol. MAG–11, No. 2, pp. 701–707 (1975).

* cited by examiner

*Primary Examiner*—Patrick Assouad
*Assistant Examiner*—Khoi Duong
(74) *Attorney, Agent, or Firm*—Foley & Lardner

(57) ABSTRACT

An arrangement for measuring the direction of the geomagnetic field $\vec{B}_E$, in the proximity of a magnetic jamming device with a magnetic field direction variable as a function of time, which is distinguished by the fact that at least two magnetic field measuring devices are provided, each of which measures all three vector components of the total magnetic field ($\vec{B}_1, \vec{B}_2$), the magnetic field measuring devices have a position, ($\vec{r}_0, \vec{r}_1, \vec{r}_2$) which is invariable as a function of time and is fixed relative to one another and relative to the jamming device, and the measured values can be called up synchronously and can be evaluated according to $\vec{B}_E = (\vec{B}_1 + \vec{B}_2)/2 + P \cdot (\vec{B}_1 - \vec{B}_2)$, $P(\vec{r}_0, \vec{r}_1, \vec{r}_2)$ describing the geometric position of the magnetic field measuring devices relative to one another and relative to the jamming device.

7 Claims, 1 Drawing Sheet

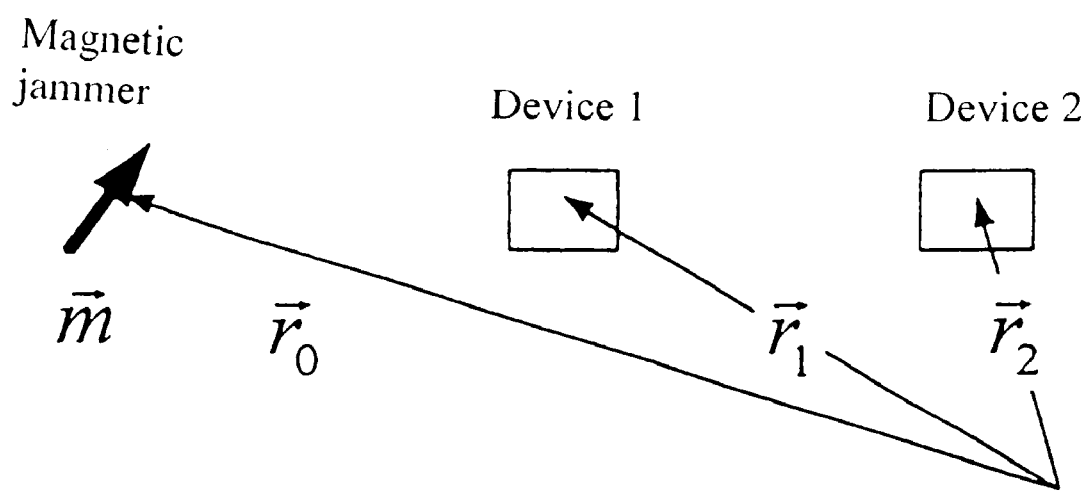

GEOMAGNETIC FIELD DIRECTION MEASURING SYSTEM

CROSS-REFERENCE TO RELATED APPLICATION

This application is the national stage application of PCT/EP98/00489, filed Jan. 30, 1998, which is entitled to priority of German Application No. 197 04 956.7, filed Feb. 10, 1997.

BACKGROUND OF THE INVENTION

1. Field of the Invention

The invention relates to an arrangement and a method for measuring the direction of the geomagnetic field $\vec{B}_E$ in the proximity of a magnetic jamming device with a magnetic field of direction which can be varied as a function of time.

2. Description of the Related Art

The direction of the geomagnetic field serves in many applications as a reference for orientation and navigation on and above the Earth's surface. The reference quantity is the direction of magnetic North, which is defined as the direction of the horizontal component of the geomagnetic field. A magnetic field measuring device DMC (Digital Magnetic Compass) developed by Leica AG, Heerbrugg, Switzerland, determines this component from the measurement of the magnetic field components in three dimensions in space and from the measurement of the horizontal position.

When the compass is installed in an electrical device, the measurement of the geomagnetic field is generally falsified by magnetic fields generated by magnetic parts of the device or current-carrying conductors. As long as these jamming devices are constant or variable only slowly as a function of time, they can be compensated by single calibration procedures or calibration procedures to be carried out over relatively large distances.

Thus, U.S. Pat. No. 4,539,760 discloses a method in which a vehicle equipped with a magnetic sensor system is brought in succession into different, predetermined orientations in space. A 3-D correction matrix for compensating magnetic interference is derived from position-dependent measured values. The method assumes interference which is constant as a function of time.

DE 38 33 798 A1 discloses a method for determining the interference effect of consumers which can be switched on and off on navigation systems. When consumers are switched off, a two-dimensional local curve of the geomagnetic field is first determined by turning the vehicle, the midpoint of which geomagnetic field is displaced by the vector of the magnetically hard interfering field present at the magnetic field sensor. Thereafter, with the vehicle stationary, the magnitude of the interfering effect of successively switched on consumers is determined and is used for correction when limits are exceeded. It is assumed that the interfering fields determined in the switched-on state always emit the same magnetically hard field. It is also necessary to know the instantaneous switching state of the jamming device.

If, however, the interference is rapidly variable, the known methods for compensating interfering fields cannot be used. A typical example of this is a device which contains a magnet which is mounted at a fixed point but is freely movable in all directions at this location, for example by means of a cardan suspension. Another example would be a coil through which a variable current flows.

SUMMARY OF THE INVENTION

An embodiment of the present invention is directed toward providing an arrangement and a method by means of which such a magnetic interference source variable as rapidly as desired can be eliminated with respect to its effect on the measurement of the direction of the geomagnetic field.

Advantageous embodiments are evident from the features described herein.

BRIEF DESCRIPTION OF THE DRAWINGS

The measuring arrangement is shown schematically in the drawing.

DESCRIPTION OF SPECIFIC EMBODIMENTS

The two magnetic field measuring devices 1 and 2 are spatially separated but arranged rigidly with respect to one another and with respect to the magnetic jamming device $\vec{m}$. Expediently, the measuring directions of the two measuring devices are aligned one behind the other or are aligned at least parallel to one another.

However, this is not essential since the measured values can be converted at any time to a common direction by suitable coordinate transformation (rotation matrices).

In any desired coordinate system, the position vectors of the jamming device and of the measuring devices are designated by $\vec{r}_0, \vec{r}_1, \vec{r}_2$.

The field of the jamming device in an unknown position and of unknown intensity is considered, according to the invention, as a magnetic dipole $\vec{m}$. The measuring devices 1 and 2 are expediently arranged so that the jamming device lies along an extension of the measuring direction formed by them. It should not lie on the central plane between the two measuring devices since, with a symmetrical position of the jamming device relative to the measuring devices, the measured information may mutually cancel out.

If, in the arrangement shown and comprising two magnetic field measuring devices measuring in three coordinates, the total field $\vec{B}_1$ and $\vec{B}_2$ detected by them is measured in each case, the geomagnetic field $\vec{B}_E$ can be determined therefrom in accordance with $$\vec{B}_E = (\vec{B}_1 + \vec{B}_2)/2 + P \cdot (\vec{B}_1 - \vec{B}_2)$$

where $$P = \begin{pmatrix} P_{11} & P_{21} & P_{31} \\ P_{12} & P_{22} & P_{32} \\ P_{13} & P_{23} & P_{33} \end{pmatrix}.$$

This evaluation procedure is based on the consideration that the field of a magnetic dipole $\vec{m}$ at the position $\vec{r}_0$ can be described at the position $\vec{r}$ by $$\vec{B}_{Dip}(\vec{r}, \vec{r}_0) = P(\vec{r}, \vec{r}_0) \cdot \vec{m}$$

where $$P(\vec{r}, \vec{r}_0) = \frac{3 \cdot \vec{d} \cdot \vec{d}^T - \vec{d}^T \vec{d} I_3}{d^5}$$

in which $$\vec{d} = \vec{r} - \vec{r_0}; \quad d = |\vec{d}| \quad \text{and} \quad I_3 = \begin{pmatrix} 1 & 0 & 0 \\ 0 & 1 & 0 \\ 0 & 0 & 1 \end{pmatrix}.$$

For the total magnetic field measured by the measuring devices 1 and 2 at the positions $\vec{r_1}$ and $\vec{r_2}$, this gives $$\vec{B_1} = \vec{B_E} + P_1 \cdot \vec{m} \text{ where } P_1 = P(\vec{r_1}, \vec{r_0})$$

$$\vec{B_2} = \vec{B_E} + P_2 \cdot \vec{m} \text{ where } P_2 = P(\vec{r_2}, \vec{r_0})$$

from which the above-mentioned evaluation procedure $$\vec{B_E} = (\vec{B_1} + \vec{B_2})/2 + P(\vec{B_1} - \vec{B_2}) \text{ where } P = -1/2(P_1 + P_2)(P_1 - P_2)^{-1}$$

is derived for $\vec{B_E}$.

The position in which the dipole in question is positioned at the time and its instantaneous magnitude are unimportant. As long as the two measuring devices operate exactly synchronously, it is also unimportant as to whether the dipole rotates or otherwise changes during the measurement. All that is important is that both measuring devices are exposed to the influence of the same dipole during the total measuring time from an unchanged position relative to one another.

Since the symmetrical matrix P depends on the positional coordinates of the jamming device and of the two measuring devices, the matrix elements can readily be determined in general from the known construction data.

However, it is also possible to determine the matrix experimentally. For this purpose, the device which contains the variable dipole should be brought to a fixed position in which the geomagnetic field $\vec{B_E}$ remains constant. The magnetic disturbance variable (dipole) is brought into many states as different as possible. In each of the positions, the magnetic fields $\vec{B_1}$ and $\vec{B_2}$ are measured and are used in the above equation for the determination, which equation can then be solved by means of any desired procedure known per se for solving linear equations for the unknown matrix elements $P_{11}$. . . $P_{33}$ and $\vec{B_E}$. Such a procedure is advantageous in particular when the system additionally contains magnetically soft materials which distort the interfering fields of the variable jamming device. The matrix P is then generally no longer symmetrical, as was assumed in the above consideration.

The arrangement according to the invention serves primarily for permitting the correct determination, at any time, of the direction of the geomagnetic field under the influence of a dipole vector of known position. However, it is evident that it can also be used for determining a dipole vector $\vec{m}$ with unknown position $\vec{r_0}$ in terms of direction and length by calculating the dipole vector $\vec{m}$, instead of the geomagnetic field $\vec{B_E}$, from the above equations for the determination.

The arrangement described can also be extended by providing more than two measuring devices in an analogous arrangement. Thus, additionally for a second or further jamming device of known position or, in an analogous manner to the above section, for further jamming devices of unknown position, their influence on the measurement of the geomagnetic field $\vec{B_E}$ can be eliminated, or accordingly their dipole vectors $\vec{m_k}$ or positions $\vec{r_k}$ in a systematic extension of the above-mentioned procedure.

However, the synchronous measurement of all measuring devices is still essential.

The determination of the position of the magnetized device can be carried out by means of three measuring devices while complying with the above-mentioned conditions according to the invention. A further independent equation for the determination, corresponding to the above-mentioned relationships, is coordinated with the additional measured value. The extended system of equations can be solved with the aid of procedures known per se for the numerical solution of nonlinear equations for the parameter $\vec{r_0}$.

We claim:

1. An arrangement for measuring a direction of a geomagnetic field $\vec{B}_E$ in a proximity of a magnetic jamming device with a magnetic field direction variable as a function of time, wherein at least two magnetic field measuring devices are provided, each of which is adapted to measure all three vector components of a total magnetic field $\vec{B}_1, \vec{B}_2$, the magnetic field measuring devices having fixed positions $\vec{r}_0, \vec{r}_1, \vec{r}_2$ which are invariable as a function of time relative to one another and relative to the magnetic jamming device, and wherein measured values can be called up synchronously and can be evaluated according to $\vec{B}_E = (\vec{B}_1 + \vec{B}_2)/2 P \cdot (\vec{B}_1 - \vec{B}_2)$, $P(\vec{r}_0, \vec{r}_1, \vec{r}_2)$ describing a geometric position of the magnetic field measuring devices relative to one another and relative to the magnetic jamming device.

2. A method of measuring a direction of a geomagnetic field $\vec{B}_E$ in a proximity of a magnetic jamming device with a magnetic field direction variable as a function of time, wherein three vector components of a total magnetic field $\vec{B}_1, \vec{B}_2$ are measured synchronously in each case by at least two magnetic field measuring devices arranged in a fixed three-dimensional arrangement relative to one another and relative to the magnetic jamming device, and are evaluated according to $\vec{B}_E = (\vec{B}_1 + \vec{B}_2)/2 + P \cdot (\vec{B}_1 - \vec{B}_2)$, $P(\vec{r}_0, \vec{r}_1, \vec{r}_2)$ being a matrix describing a geometric position of the magnetic field measuring devices relative to one another and relative to the magnetic jamming device.

3. The method as claimed in claim 2, wherein the matrix P is determined from normal construction data.

4. The method as claimed in claim 2, wherein the matrix P is determined by measurement, by keeping a total device in a fixed three-dimensional position and bringing the magnetic jamming device into one or more different states in which the total magnetic field is measured and a system of linear equations for a determination is formed therefrom.

5. An arrangement for measuring a direction of a geomagnetic field $\vec{B}_E$ in a proximity of a magnetic jamming device with a magnetic field direction variable as a function of time, the arrangement comprising:

at least two magnetic field measuring devices, each of which is adapted to measure three vector components of a magnetic field $\vec{B}_1, \vec{B}_2$, the magnetic field measuring devices having fixed positions $\vec{r}_0, \vec{r}_1, \vec{r}_2$ which are invariable as a function of time relative to one another and relative to the magnetic jamming device, and wherein measured values of vector components of the magnetic field can be called up synchronously and can be evaluated by at least one of the magnetic field measuring devices according to $\vec{B}_E = (\vec{B}_1 + \vec{B}_2)/2 + P \cdot (\vec{B}_1 - \vec{B}_2)$, wherein $P(\vec{r}_0, \vec{r}_1, \vec{r}_2)$ describes a geometric position of the magnetic field measuring devices relative to one another and relative to the magnetic jamming device.

6. A method of measuring a direction of a geomagnetic field $\vec{B}_E$ in a proximity of a magnetic jamming device with a magnetic field direction variable as a function of time, the method comprising:

synchronously measuring three vector components of a magnetic field $\vec{B}_1, \vec{B}_2$ using at least two magnetic field measuring devices arranged in a fixed three-dimensional arrangement relative to one another and relative to the magnetic jamming device; and evaluating measured vector components of the magnetic field according to $\vec{B}_E = (\vec{B}_1 + \vec{B}_2)/2 + P \cdot (\vec{B}_1 - \vec{B}_2)$, $P(\vec{r}_0, \vec{r}_1, \vec{r}_2)$ being a matrix describing a geometric position of the magnetic field measuring devices relative to one another and relative to the magnetic jamming device.

7. The method as claimed in claim 2, wherein the matrix P is determined by measurement, by keeping the magnetic field measuring devices in fixed three-dimensional positions and bringing the magnetic jamming device into one or more different states in which the magnetic field is measured, and forming therefrom a system of linear equations.

* * * * *